(12) United States Patent
Lin et al.

(10) Patent No.: US 12,074,057 B2
(45) Date of Patent: Aug. 27, 2024

(54) ISOLATION STRUCTURES

(71) Applicant: Taiwan Semiconductor Manufacturing Co., Ltd., Hsin-Chu (TW)

(72) Inventors: Ta-Chun Lin, Hsinchu (TW); Kuo-Hua Pan, Hsinchu (TW); Jhon Jhy Liaw, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 54 days.

(21) Appl. No.: 18/057,688

(22) Filed: Nov. 21, 2022

(65) Prior Publication Data

US 2023/0081710 A1    Mar. 16, 2023

Related U.S. Application Data

(63) Continuation of application No. 16/696,272, filed on Nov. 26, 2019, now Pat. No. 11,515,199.

(60) Provisional application No. 62/891,615, filed on Aug. 26, 2019.

(51) Int. Cl.
*H01L 21/762*    (2006.01)
*G06F 30/392*    (2020.01)
*H01L 21/84*    (2006.01)
*H01L 29/06*    (2006.01)

(52) U.S. Cl.
CPC ...... *H01L 21/76283* (2013.01); *H01L 21/845* (2013.01); *H01L 29/0649* (2013.01); *G06F 30/392* (2020.01)

(58) Field of Classification Search
CPC ............. H01L 21/76283; H01L 21/845; H01L 27/0207; H01L 27/0921; H01L 27/0924; H01L 27/0928; H01L 27/11807; H01L 29/0649; H01L 29/1087; H01L 29/7848; H01L 2027/11831; G06F 30/392
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |

(Continued)

OTHER PUBLICATIONS

Lin, Ta-Chun et al., "Gate Structure and Method," U.S. Appl. No. 16/397,248, filed Apr. 29, 2019, 42 pages.

*Primary Examiner* — Nelson Garces
(74) *Attorney, Agent, or Firm* — HAYNES AND BOONE, LLP

(57) ABSTRACT

Semiconductor structures and methods are provided. A semiconductor structure according to an embodiment includes a first cell disposed over a first well doped with a first-type dopant, a second cell disposed over the first well, and a tap cell disposed over the first well. The tap cell is sandwiched between the first cell and the second cell. The first cell includes a first plurality of transistors and the second cell includes a second plurality of transistors.

20 Claims, 9 Drawing Sheets

Fig. 2

(56) References Cited

U.S. PATENT DOCUMENTS

| | | | |
|---|---|---|---|
| 2017/0062474 A1* | 3/2017 | Lee | H01L 27/0207 |
| 2017/0243888 A1* | 8/2017 | Shimbo | H01L 23/66 |
| 2017/0250197 A1* | 8/2017 | Shimbo | H01L 27/0629 |
| 2019/0393206 A1* | 12/2019 | Wang | H01L 29/0696 |
| 2020/0295004 A1* | 9/2020 | Kim | H01L 29/0653 |

* cited by examiner

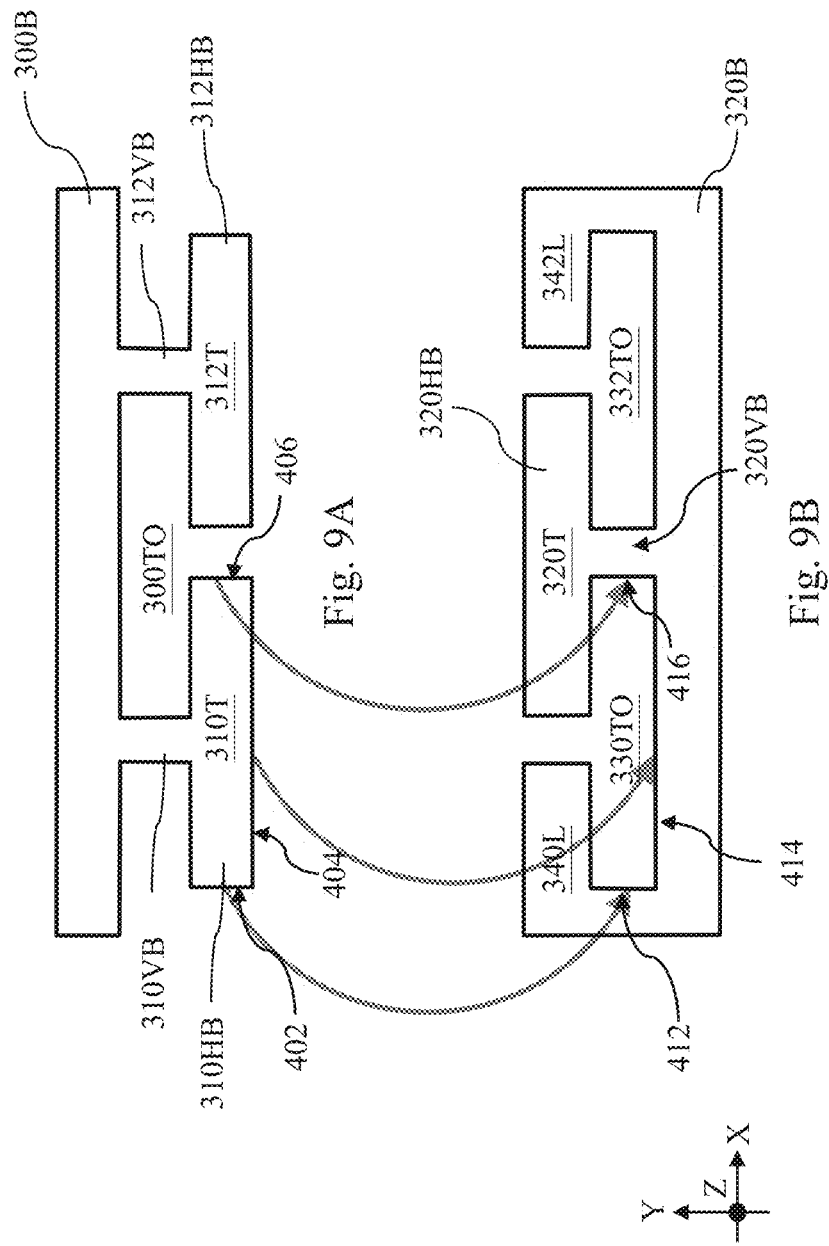

ISOLATION STRUCTURES

PRIORITY DATA

This is a continuation application of U.S. patent application Ser. No. 16/696,272, filed on Nov. 26, 2019, which is a non-provisional application of and claims priority to U.S. Provisional Application No. 62/891,615, filed on Aug. 26, 2019, each of which is herein incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Latch-up is failure mechanism of complementary metal oxide semiconductor (CMOS) ICs characterized by excessive drain current coupled with device failure or device destruction. A latch-up is largely resulted from parasitic PNP and NPN bipolar transistors due to arrangements of wells and active doping regions in a bulk substrate. CMOS devices fabricated on silicon-on-insulator (SOI) substrate is generally resistant to latch-up because n-wells and p-wells are substantially isolated due to the presence of the embedded silicon oxide isolation layer. Latch-up prevention devices, such as guard rings and tap cells, are routinely incorporated in circuit designs. Tap cells are placed among standard cells and are isolated from the standard cells by one or more isolation structures. The tap cells and the isolation structures may increase the overall size of the integrated circuit. Given a fixed area of an IC chip, the tap cells and the isolation structures may displace the real estate for functional devices. While the conventional structures for tap cells are adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9A illustrates a shape of a well of the second layout design in FIG. 4, according to various aspects of the present disclosure.

FIG. 9B illustrates a shape of another well of the second layout design in FIG. 4, according to various aspects of the present disclosure.

DETAILED DESCRIPTION

Figure 1:
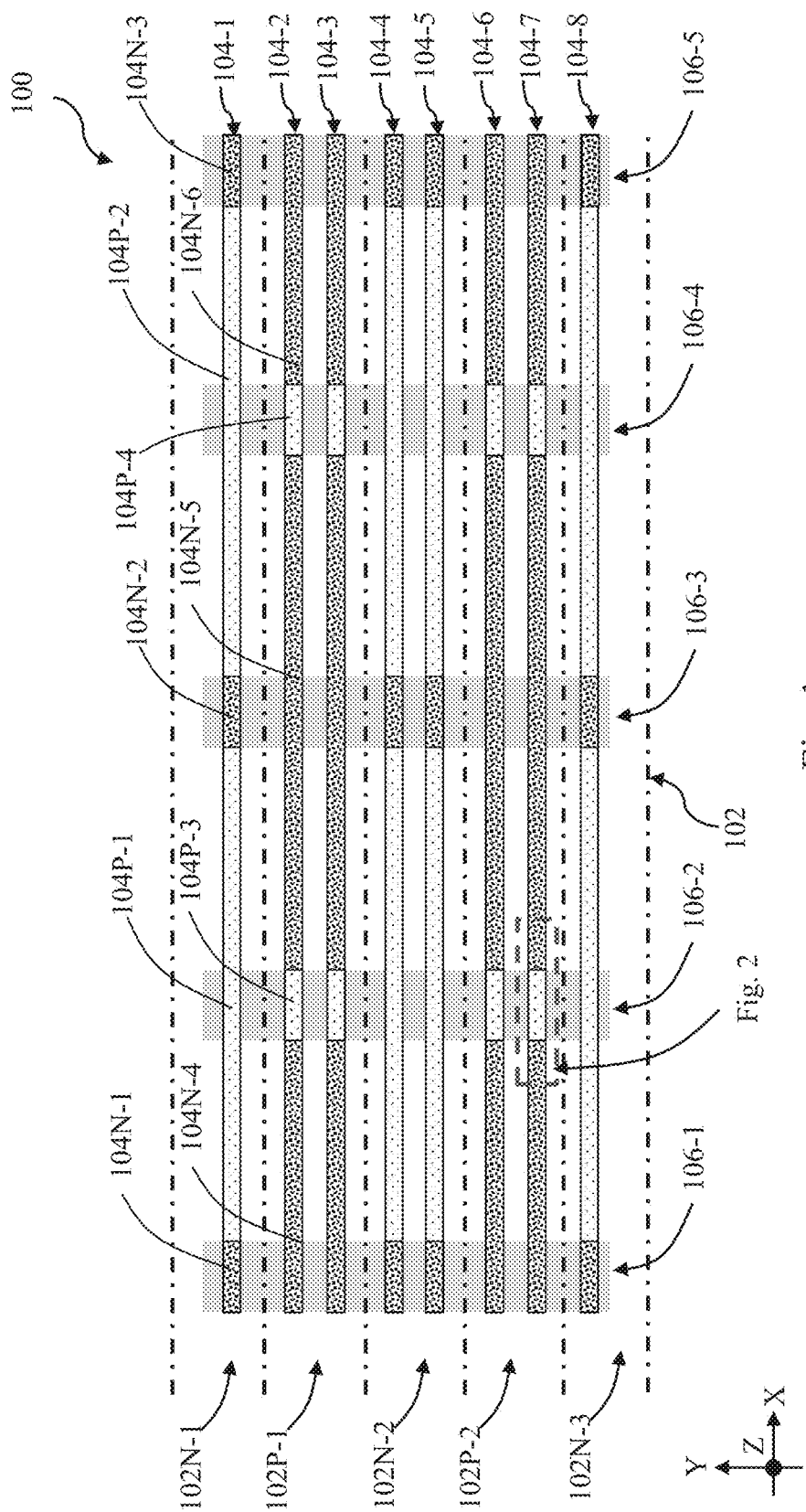
FIG. 1 is a diagrammatic top view of a first layout design that includes a plurality of tap cells and a plurality of standard cells, according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper." "horizontal," "vertical," "above," "over," "below," "beneath," "up." "down." "top," "bottom," etc. as well as derivatives thereof (e.g., "horizontally." "downwardly," "upwardly," etc.) are used for case of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

In circuit design, a standard cell is a block of transistors that is repeated according to a set of design rules across a design layout. A standard cell may be used for different functions. For example, a standard cell may be a static random access memory (SRAM) standard cell or a logic cell for logic operations. A standard cell may include one or more p-type transistors and one or more n-type transistors. The transistors may be planar transistors or multi-gate transistors, such as fin-type field effect transistors (FinFETs)

or gate-all-around (GAA) transistors. To fabricate transistors on bulk substrates, n-type wells doped with n-type dopants and p-type wells doped with p-type dopants are formed in the bulk substrate and active regions of opposite conductivity types are formed over the respective n-type wells and p-type wells. Accordingly, a p-type transistor includes a p-type active region formed over an n-type well (n-well) and an n-type transistor includes an n-type active region formed over a p-type well (p-well). When an n-type transistor is placed adjacent to a p-type transistor, a parasitic PNP bipolar transistor may be formed among a p-type active region, the n-type well underlying the p-type active region, and the adjacent p-type well (sometimes this p-type well is formed across the substrate). Similarly, a parasitic NPN bipolar transistor may be formed along an n-type active region, the p-type well underlying the n-type active region (sometimes this p-type well is formed across the substrate), and the adjacent n-type well. The parasitic NPN and PNP bipolar transistors may be latched-up to form an inverter amplifier that shorts drain supply voltage Vdd and ground, which may lead to destruction of the device.

Tap cells may be implemented to prevent shorting of drain to ground by way of the parasitic bipolar transistors. In some instances, tap cells may be used to couple certain n-wells to Vdd (drain supply voltage or positive supply voltage) and the p-well on the substrate to Vss (source supply voltage or negative supply voltage). In some implementations, Vdd is the most positive voltage of the standard cell or IC device and Vss is the most negative voltage of the standard cell or IC device. Vss may be the ground voltage or may be grounded. Tap cells may take shape of a transistor but they do not have functional gate structures. Tap cells perform their latch-up prevention function through their source/drain regions. Different from transistors in standard cells, the active regions in a tap cell do not have a different conductivity type from that of the underlying well. For example, when a tap cell is formed over an n-well, it has an active region doped with n-type dopants, rather than p-type dopants. When a tap cell is formed over a p-well, it has an active region doped with p-type dopants, rather than n-type dopants.

In some conventional designs, the n-wells and p-wells extend along the same direction, each have an elongated shape, and are alternately arranged. In these conventional designs, elongated active regions, such as fins or vertical stacks of channel members, may be formed over the n-wells or the p-wells and doped with different types of dopants. Although a tap cell and a standard cell may be formed in the same active region, the different doping types prevent them from being placed right next to each other. This is so because when an active region of the tap cell abuts an active region of a different conductivity type of the standard cell, it gives rise drift of electrical characteristics of the standard cells and deteriorated performance. To isolate a tap cell from an adjacent standard cell, discontinuations of the active regions are introduced. Because the active regions are disposed in and defined by a silicon-oxide containing isolation feature (such as a shallow trench isolation, or STI), the active regions may be referred to ODs and the discontinuations of the active regions may be referred to as OD breaks. In some embodiments, OD breaks are formed before the deposition of the isolation feature and the formation of the source/drain features. Because the OD breaks are formed before the deposition of the isolation feature, the material for the isolation feature is also deposited in the OD breaks. Because the OD breaks are formed before the formation of the source/drain features that exert stress on the active region, the active regions adjacent to the OD breaks are exposed to different environment and may have different properties. The OD breaks therefore also bring about a form of layout dependent effect (LDE) where the active region of the standard cell is broken by another active region of the tap cell. To address the LDE brought about by the OD breaks, dummy cells of various sizes may be introduced between the standard cells and the OD breaks to serve as a transition between an OD break and the standard cell. In light of the foregoing, it can be seen that the tap cell itself and its isolation structures in the convention design can take up an undue amount of real estate in an IC chip.

The present disclosure provides structures that require smaller isolation structures to isolate a tap cell from a standard cell. According to some embodiments, a fin-cut dielectric feature, which is formed after the formation of the source/drain features and metal gate structures, is used to isolate a tap cell from a standard cell. The formation and structure of a fin-cut dielectric feature is described in U.S. patent application Ser. No. 16/397,248, filed Apr. 29, 2019, which is hereby incorporated by reference in its entirety. Because the fin-cut dielectric feature is formed after the stress-exerting source/drain features, the structure of the present disclosure does not require any OD break to be inserted between the tap cell and the standard cell. In some embodiments, the structure includes an n-well that interlocks with a p-well. In those embodiments, active regions of a tap cell and adjacent standard cells are doped with the same type of dopant but are disposed over different types of wells. The structures according to the present disclosure include smaller isolation structures to isolate tap cells and standard cells and have comparable or even better performance.

FIG. 1 illustrates a schematic top view of a first layout design 100 of an IC structure, in accordance with some embodiments. In the embodiments represented in FIG. 1, the first layout design 100 includes a plurality of n-type wells (n-wells) 102N-1, 102N-2, and 102N-3 that are interleaved with a plurality of p-type wells (p-wells) 102P-1 and 102P-2 in a substrate 102. In the depicted embodiment, substrate 102 includes silicon. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGc), GaAsP, AlInAs, AlGaAs, GaInAs, GaInP, and/or GaInAsP; or combinations thereof. In some implementations, substrate 102 includes one or more group III-V materials, one or more group II-IV materials, or combinations thereof. Each of the plurality of n-wells is doped with n-type dopants, such as phosphorus, arsenic, other n-type dopant, or combinations thereof. Each of the plurality of p-wells is doped with p-type dopants, such as boron, indium, other p-type dopant, or combinations thereof. An ion implantation process, a diffusion process, and/or other suitable doping process can be performed to form the various doped regions.

In some implementations, the first layout design 100 includes a plurality of elongated active regions, including active regions 104-1, 104-2, 104-3, 104-4, 104-5, 104-6, 104-7, and 104-8. Each of the active regions may be a fin formed of silicon (or other semiconductor material) when the IC structure includes a fin-type field effect transistor (FinFET) device or may include a vertical stack of semiconductor layers when the IC structure includes a gate-all around (GAA) device. Each of the plurality of active regions 104-1, 104-2. 103-3, 104-4, 104-5, 104-6, 104-7, and 104-8 is elongated in shape and extends over and parallel to each of the plurality of wells. For example, the active region 104-1 is disposed over and extends parallel to the first n-well 102N-1, the active regions 104-2 and 104-3 are disposed over and extends parallel to the first p-well 102P-1, the active regions 104-4 and 104-5 are disposed over and extends parallel to the second n-well 102N-2, the active regions 104-6 and 104-7 are disposed over and extend parallel to the second p-well 102P-2, and the active region 104-8 is disposed over and extends parallel to the third n-well 102N-3.

Each of the active regions includes differently doped areas to accommodate tap cells 106-1, 106-2, 106-3, 106-4, and 106-5 and standard cells disposed between two adjacent tap calls. Taking the active region 104-1 as an example of an active region disposed in an n-well, it includes n-doped areas 104N-1, 104N-2, and 104N-3 for formation of tap cells and p-doped areas 104P-1 and 104P-2 for formation of standard cells. Similar doping arrangements can also be found in active regions 104-4, 104-5 and 104-8. Taking the active region 104-2 as an example of an active region disposed in a p-well, it includes p-doped areas 104P-3 and 104P-4 for formation of tap cells and n-doped areas 104N-4, 104N-5, and 104N-6 for formation of standard cells. Similar doping arrangements can also be found in active regions 104-3, 104-6 and 104-7. It is noted that each of the tap cells 106-1, 106-2, 106-3, 106-4, and 106-5 includes areas of active regions that are doped with the same conductivity type of dopants as in the underlying well. Each of the standard cells includes areas of active regions that are doped with different conductivity of dopants from the underlying well. To illustrate different further aspects of the present disclosure, a portion of FIG. 1 is enlarged and illustrated in FIG. 2.

Figure 2:
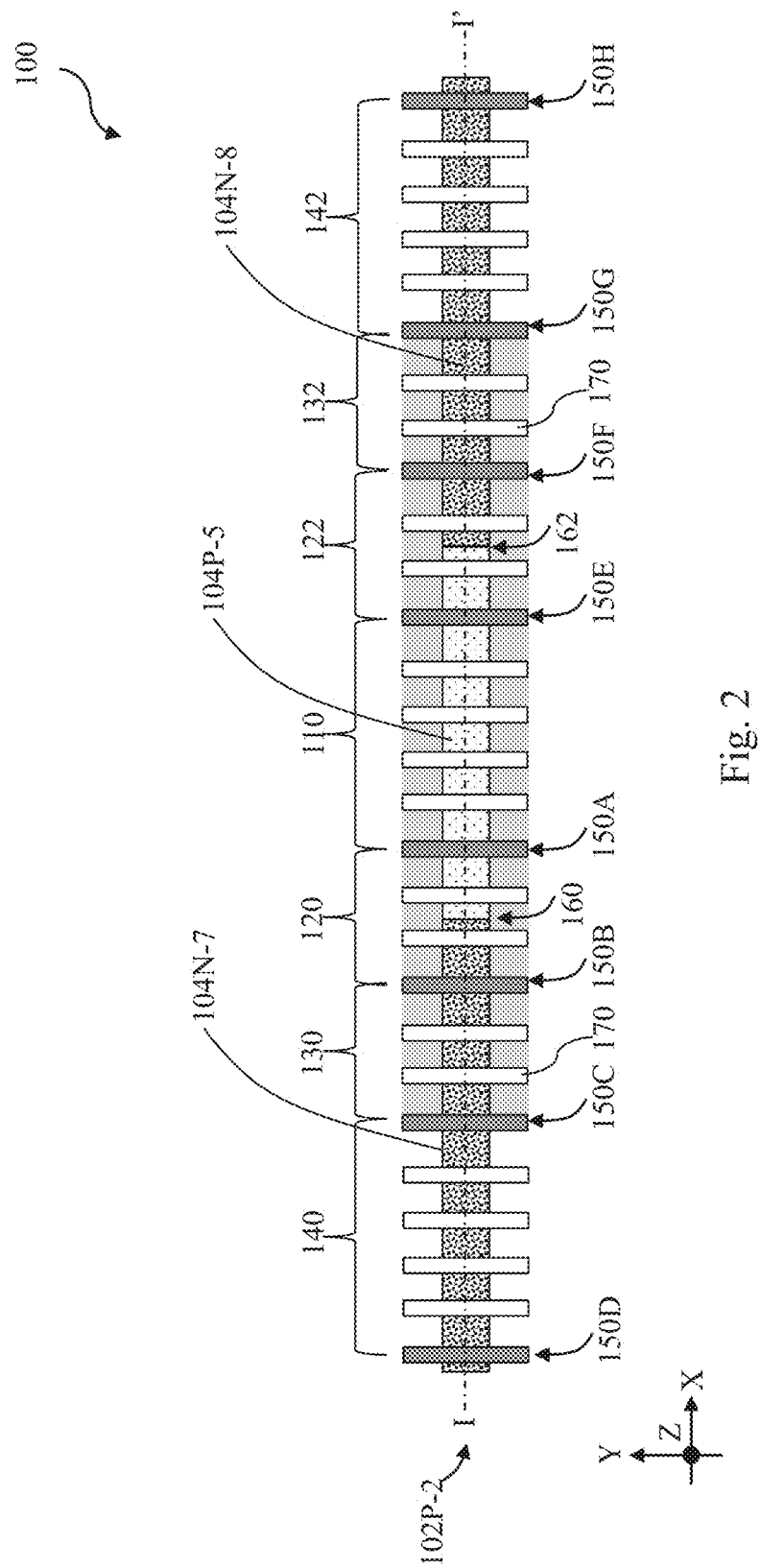
FIG. 2 is an enlarged top view of a portion of the first layout design in FIG. 1, according to various aspects of the present disclosure.

As shown in FIG. 2, the fragment of the first layout design 100 in FIG. 2 includes a tap cell segment 110 sandwiched between standard cell segments 140 and 142. For purpose of the present disclosure, a tap cell segment is a portion of a tap cell that resides over an active region. As illustrated in FIG. 1, the tap cell segment 110 is the portion of the tap cell 106-2 that resides over the active region 104-7. In addition, for purpose of this disclosure, a standard cell segment is a portion of a standard cell that resides over an active region. As illustrated in FIG. 1, the standard cell segment 140 is the portion of the standard cell between the tap cell 106-1 and the tap cell 106-2 and the standard cell segment 140 also resides over the active region 104-7. The standard cell segment 142 is the portion of the standard cell between the tap cell 106-2 and the tap cell 106-3 and the standard cell segment 142 also resides over the active region 104-7. Each of the standard cells in the first layout design 100 may be a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM), read only memory (ROM), or the like. In some embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, GAA devices, planar MOS transistors with raised source/drain, or the like. Examples of passive elements include, but are not limited to, capacitors, inductors, fuses, resistors, or the like.

Referring still to FIG. 2, the tap cell segment 110 is spaced apart from the standard cell segment 140 by a first fin-cut dielectric feature 150A, a first transition zone 120, a second fin-cut dielectric feature 150B, a first dummy cell 130, and a third fin-cut dielectric feature 150C. While the active region (p-doped region 104P-5) of the tap cell segment 110 is spaced apart from the active region (n-doped region 104N-7) of the standard cell 140, they are aligned along the X direction as they are doped areas of the same active region to begin with. In some embodiments, the standard cell segment 140 is bounded between the third fin-cut dielectric feature 150C and a fourth fin-cut dielectric feature 150D. Similarly, the tap cell segment 110 is spaced apart from the standard cell segment 142 by a fifth fin-cut dielectric feature 150E, a second transition zone 122, a sixth fin-cut dielectric feature 150F, a second dummy cell 132, and a seventh fin-cut dielectric feature 150G. While the active region (p-doped region 104P-5) of the tap cell segment 110 is spaced apart from the active region (n-doped region 104N-8) of the standard cell 142, they are aligned along the X direction as they are doped areas of the same active region to begin with. In some embodiments, the standard cell segment 142 is bounded between the seventh fin-cut dielectric feature 150G and an eighth fin-cut dielectric feature 150H. In some implementations shown in FIG. 2, a first junction 160 (or first interface 160) between the p-doped area 104P-5 and the n-doped area 104N-7 falls within the first transition zone 120 and the first junction 160 is disposed between two fin-cut dielectric features, namely the first fin-cut dielectric feature 150A and the second fin-cut dielectric feature 150B. A second junction 162 (or second interface 162) between the p-doped area 104P-5 and the n-doped area 104N-8 falls within the second transition zone 122 and the second junction 162 is disposed between two fin-cut dielectric features, namely the fifth fin-cut dielectric feature 150E and the sixth fin-cut dielectric feature 150F. In some embodiments, the first and second dummy cell 130 and 132 may include transistors that are not operational. For example, the first and second dummy cells 130 and 132 may include gate structures 170 that are electrically coupled to one of the source/drain features adjacent to the gate structures.

Figure 3:
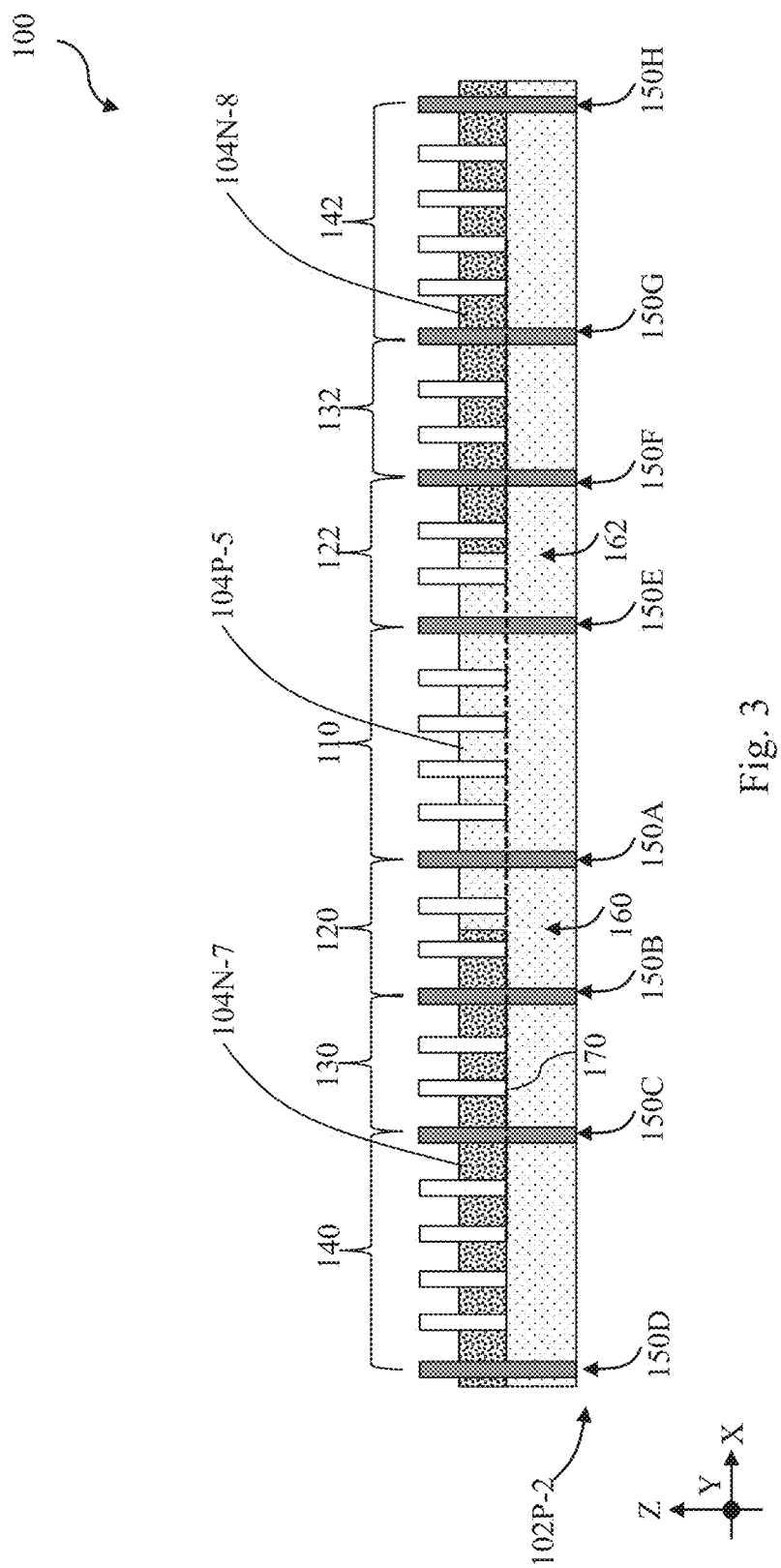
FIG. 3 is a side view of the portion of the first layout design in FIG. 1, according to various aspects of the present disclosure.

The I-I' cross-section of FIG. 2 along the Y-direction is illustrated in FIG. 3. It is noted that the I-I' cross-section passes along a lengthwise direction of the active region 104-7. It can be seen that the embodiments represented in FIG. 3 do not include any OD break inserted between the tap cell segment 110 and the standard cell segment 140 or between the tap cell segment 110 and the standard cell segment 142. This is evidenced by the fact that no isolation feature (such as shallow trench isolation (STI)) is visible in FIG. 3. As described above, an OD break is a discontinuation in an active region formed before the formation of the isolation feature (such as STI). An OD break, if present, would be filled with the isolation feature. As FIG. 2 illustrates no isolation feature that breaks up the active region 104-7, embodiments represented in FIG. 3 do not include any OD break.

Figure 4:
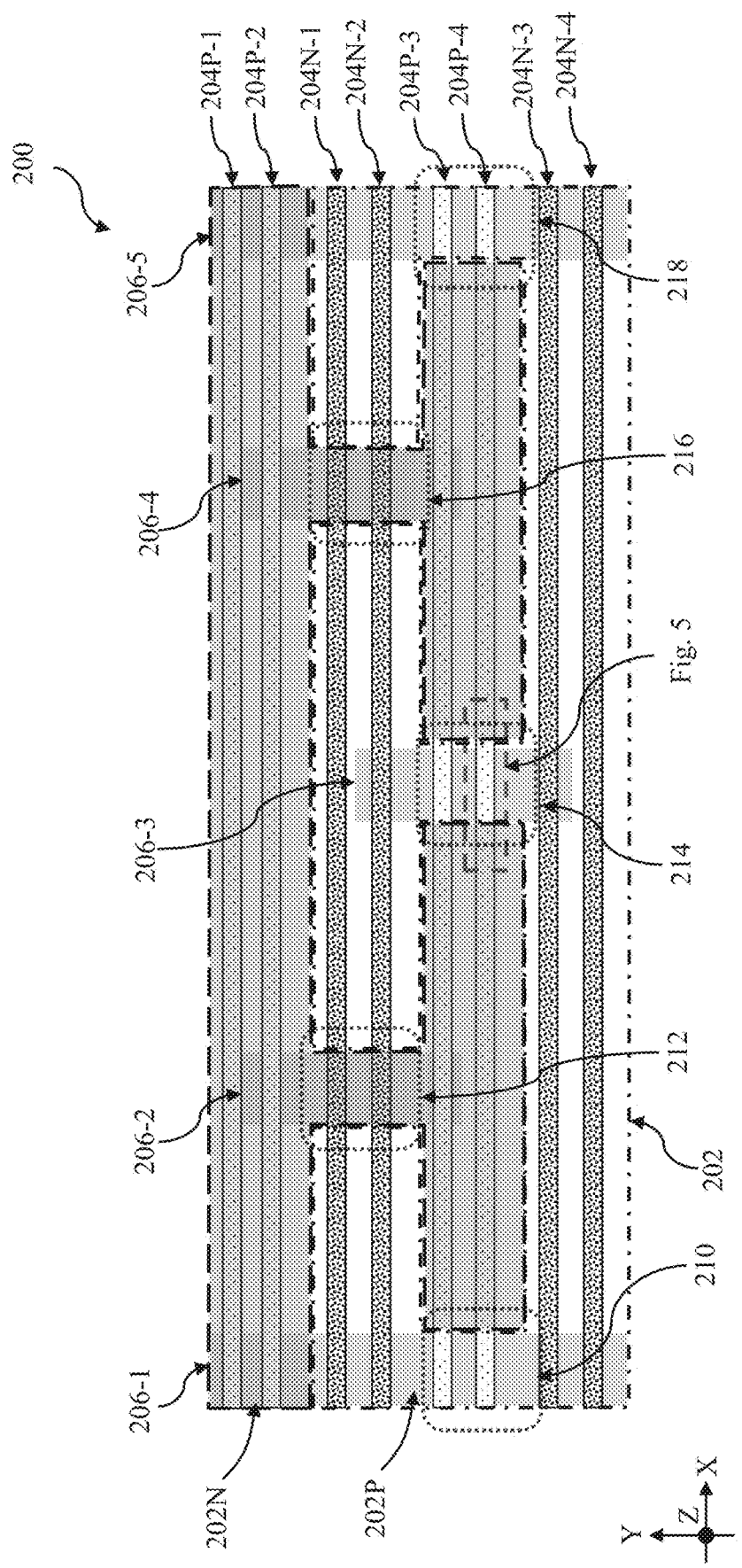
FIG. 4 is a diagrammatic top view of a second layout design that includes a plurality of tap cells and a plurality of standard cells, according to various aspects of the present disclosure.

FIG. 4 illustrates a schematic top view of a second layout design 200 of an IC structure, in accordance with some embodiments. In the embodiments represented in FIG. 4, the second layout design 200 includes an n-type well (n-well) 202N and a p-type well (p-well) 202P in a substrate 202. In some embodiments, the n-well 202N and the p-well 202P are not elongated in shape as the n-wells (102N-1, 102N-2 and 102P-3) and the p-wells (102P-1, 102P-2 and 102P-3) in FIG. 1. In those embodiments, the n-well 202N and p-well 202P are keyed to one another such that they may interlock. Reference is now made to FIGS. 9A and 9B. The shape of the n-well 202N in FIG. 4 may be further illustrated in FIG. 9A in more details. As shown in FIG. 9A, the shape of the n-well 202N includes a first base 300B, a first T-shape portion 310T, and a second T-shape portion 312T. The first T-shape portion 310T includes a first vertical bar portion 310VB and a first horizontal bar portion 310HB, with the first vertical bar portion 310VB t-boning the first horizontal bar portion 310HB. The first T-shape portion 310T is coupled to a long side of the first base 300B via the first vertical bar portion 310VB. The second T-shape portion 312T includes a second vertical bar portion 312VB and a second horizontal bar portion 312HB, with the second vertical bar portion 312VB t-boning the second horizontal bar portion 312HB. The second T-shape portion 312T is coupled to a long side of the first base 300B via the second vertical bar portion 312VB. The first base 300B, the first T-shape portion 310T, and the second T-shape portion 312T collectively define a first T-shape opening 300TO. As shown in FIG. 9B, the shape of the p-well 202P includes a second base 320B, a third T-shape portion 320T, a first L-shape portion 340L, and a second L-shape portion 342L. The third T-shape portion 320T includes a third vertical bar portion 320VB and a third horizontal bar portion 320HB, with the third vertical bar portion 320VB t-boning the third horizontal bar portion 320HB. The third T-shape portion 320T is coupled to a long side of the second base 320B via the third vertical bar portion 320VB. The second base 320B, the first L-shape portion 340L, and the third T-shape portion 320T collectively define a second T-shape opening 330TO. The second base 320B, the third T-shape portion 320T, and the second L-shape portion 342L collectively define a third T-shape opening 332TO.

As demonstrated in FIG. 4, the shape in FIG. 9A and the shape in FIG. 9B may match and interlock to form a rectangular shape. When interlocked, the first T-shape portion 310T fits within the second T-shape opening 330TO, the second T-shape portion 312T fits within the third T-shape opening 332TO, the third T-shape portion 320T fits within the first T-shape opening 300TO, the first L-shape portion 340L latches onto a side of the first T-shape portion 310T, and the second L-shape portion 342L latches onto a side of the second T-shape portion 312T. Put differently, when the shapes in FIG. 9A and FIG. 9B are fitted together, the first T-shape portion 310T and the second T-shape portion 312T of the shape in FIG. 9A extend into the shape in FIG. 9B and borders the shape in FIG. 9B on all sides, except for the side where they are connected to the first base 300B. For example, the first T-shape portion 310T includes a first exterior side 402 along the Y direction, a second exterior side 404 along the X direction, and a third exterior side 406 along the Y direction and the second T-shape opening 330TO includes a first interior side 412 along the Y direction a second interior side 414 along the X direction and a third interior side 416 along the Y direction. When the shape in FIG. 9A and the shape in FIG. 9B match and interlock to form a rectangular shape, the first T-shape portion 310T would engage the second T-shape opening 330TO such that the first exterior side 402 borders the first interior side 412, the second exterior side 404 borders the second interior side 414, and the third exterior side 406 borders the third interior side 416. The same holds true for the second T-shape portion 312T and the third T-shape opening 330TO. Similarly, when the shapes in FIG. 9A and FIG. 9B are fitted together, the third T-shape portion 320T of the shape in FIG. 9B extends into the shape in FIG. 9A and borders the shape in FIG. 9A on all sides, except for the side where it is connected to the second base 320B. Matching the shapes in FIGS. 9A and 9B to the embodiments represented in FIG. 4, the n-well 202N includes two T-shape portions that extend into the p-well 202P and border the p-well 202P on three sides (along the X direction and the Y direction). In a similar manner, the p-well 202P includes a T-shape portion that extends into the n-well 202N and borders the n-well 202N on three sides (along the X direction and the Y direction).

While FIG. 4 illustrates that the n-well 202N takes the shape shown in FIG. 9A, and the p-well 202P takes the shape shown FIG. 9B, a person of ordinary skill in the art would appreciate that the n-well 202N may also take the shape shown in FIG. 9B while the p-well 202P may take the shape shown in FIG. 9A. The interlocking of the shape in FIG. 9A and the shape in FIG. 9B dictated by the intent to maximize areas for the standard cell and minimize areas for tap cells. For example, in at least some embodiments, the narrow vertical bar portion (310VB, 312VB, and 320VB) is used for forming a tap cell segment, which is to be aerially minimized, and the wide horizontal bar portion (310HB, 312HB, and 320HB) is used for forming a standard cell, which is to be aerially maximized. A person of ordinary skill in the art would also appreciate that while well boundaries are described and depicted as having perfectly straight lines, well boundaries in reality may be blurred. That said, the shape of the wells may still be discerned and detected by dopant types, dopant concentrations, and types of devices fabricated thereon.

Referring now back to FIG. 4, the second layout design 200 in FIG. 4 includes four continuous and elongated p-doped active regions 204P-1, 204P-2, 204P-3, and 204P-4 as well as four continuous and elongated n-doped active regions 204N-1, 204N-2, 204N-3, and 204N-4. The p-doped active regions 204P-1 and 204P-2 are disposed completely within the n-well 202N. The n-doped active region 204N-3 and 204N-4 are disposed completely within the p-well 202P. Applying terms described in conjunction with FIGS. 9A and 9B, the p-doped active regions 204P-1 and 204P-2 are disposed completely within the first base 300B and the n-doped active regions 204N-3 and 204N-4 are disposed completely within the second base 320B. The same cannot be said for the n-doped active regions 204N-1 and 204N-2 and the p-doped active regions 204P-3 and 204P-4 as they span over both the n-well 202N and the p-well 202P. In some implementations, the second layout design 200 in FIG. 4 includes five tap cells 206-1, 206-2, 206-3, 206-4, and 206-5. Each of the five tap cells includes a tap cell segment whose active region and the underlying well are doped with dopants of the same conductivity type. The tap cell 206-1 includes a first tap cell segment 210 that includes p-doped active regions (204P-3 and 204P-4) disposed over the p-well 202P. The tap cell 206-2 includes a second tap cell segment 212 that includes n-doped active regions (204N-1 and 204N-2) disposed over the n-well 202N. The tap cell 206-3 includes a third tap cell segment 214 that includes p-doped active regions (204P-3 and 204P-4) disposed over the p-well 202P. The tap cell 206-4 includes a fourth tap cell segment 216 that includes n-doped active regions (204N-1 and 204N-2) disposed over the n-well 202N. The tap cell 206-5 includes a fifth tap cell segment 218 that includes p-doped active regions (204P-3 and 204P-4) disposed over the p-well 202P. A portion of the third tap cell segment 214 is enlarged and illustrated in FIG. 5.

Figure 5:
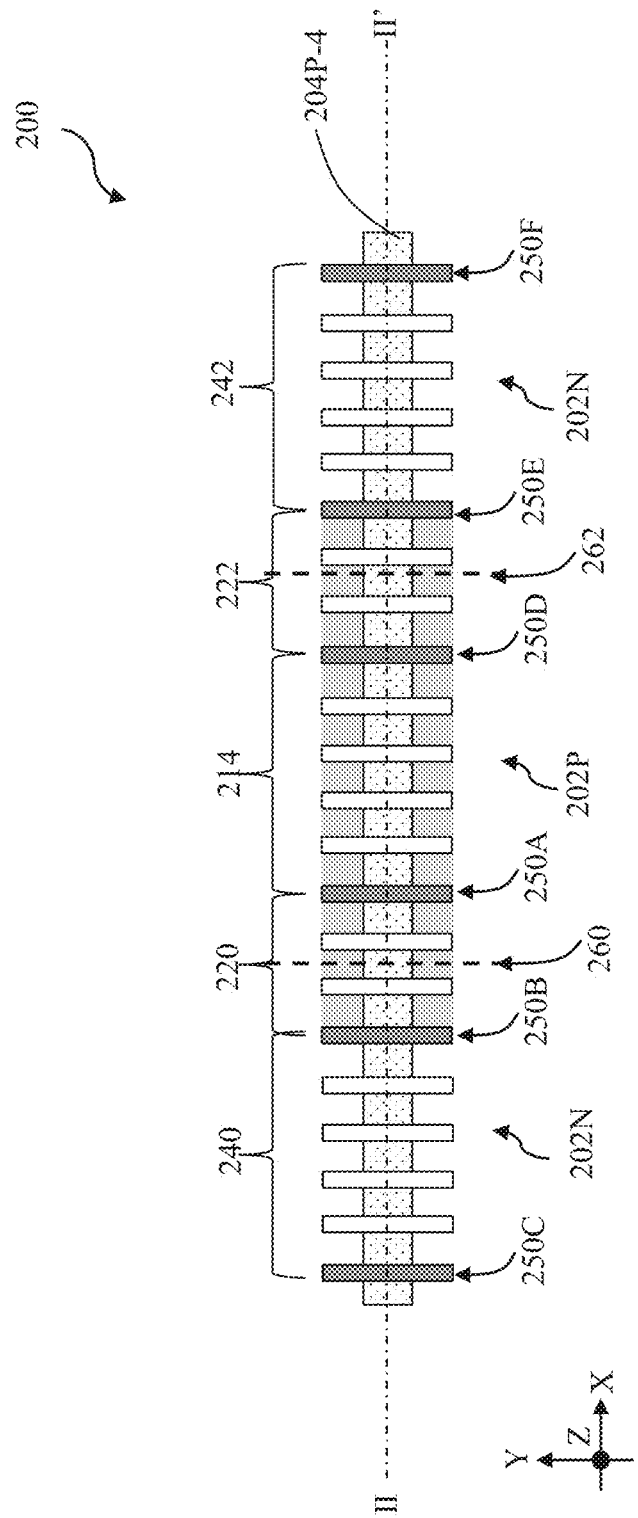
FIG. 5 is an enlarged top view of a portion of the second layout design in FIG. 4, according to various aspects of the present disclosure.

As shown in FIG. 5, the fragment of the second layout design 200 in FIG. 4 includes the third tap cell segment 214 (or a portion of the third tap cell segment 214 in FIG. 4, to be precise) sandwiched between standard cell segments 240 and 242. As illustrated in FIG. 4, the standard cell segment 240 is the portion of the standard cell between the first tap cell segment 210 and the third tap cell segment 214. The standard cell segment 240 is therefore disposed over the n-well 202N in its entirety. The standard cell segment 242 is the portion of the standard cell between the third tap cell segment 214 and the fifth tap cell segment 218. The standard cell segment 242 is therefore also disposed over the same n-well 202N in its entirety. That is, the third tap cell segment 214 is sandwich between two standard cell segments that are formed over the same n-well 220N. While not enlarged and shown separately, each the first tap cell segment 210, the second tap cell segment 212, the fourth tap cell segment 216, and the fifth tap cell segment 218 is sandwiched between two standard cell segments that are disposed over the same n-well or p-well. For example, the second tap cell segment 212 is disposed between two standard cell segments formed over the p-well 202P. The fourth tap cell segment 216 is sandwiched between two standard cell segments that are disposed over the same p-well 202P. In at least some embodiments, the second layout design 200 is repeating unit that may be repeatedly applied and transfer to other areas of the substrate 202, including areas immediate adjacent to the second layout design 200. That is, the second layout design 200 in FIG. 4 may be copied and repeatedly placed immediately above, below, to the left, or to the right of the second layout design 200.

Each of the standard cells in the second layout design 200 may be a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM), read only memory (ROM), or the like. In some embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, GAA devices, planar MOS transistors with raised source/drain, or the like. Examples of passive elements include, but are not limited to, capacitors, inductors, fuses, resistors, or the like.

Referring still to FIG. 5, the third tap cell segment 214 is spaced apart from the standard cell segment 240 by a ninth fin-cut dielectric feature 250A, a third transition zone 220, and a tenth fin-cut dielectric feature 250B. In some embodiments, the standard cell segment 240 is bounded between the tenth fin-cut dielectric feature 250B and a eleventh fin-cut dielectric feature 250C. Similarly, the third tap cell segment 214 is spaced apart from the standard cell segment 242 by a twelfth fin-cut dielectric feature 250D, a fourth transition zone 222, and a thirteenth fin-cut dielectric feature 250E. In some embodiments, the standard cell segment 242 is bounded between the thirteenth fin-cut dielectric feature 250E and a fourteenth fin-cut dielectric feature 250F. Unlike the layout design 100 shown in FIGS. 1-3, the second layout design 200 does not include any junction or transition between a p-doped area and an n-doped area of an active region between a standard cell and a tap cell. Instead, in the second layout design 200, one or more well junction or well transitions are found between a standard cell and a tap cell.

Figure 6:
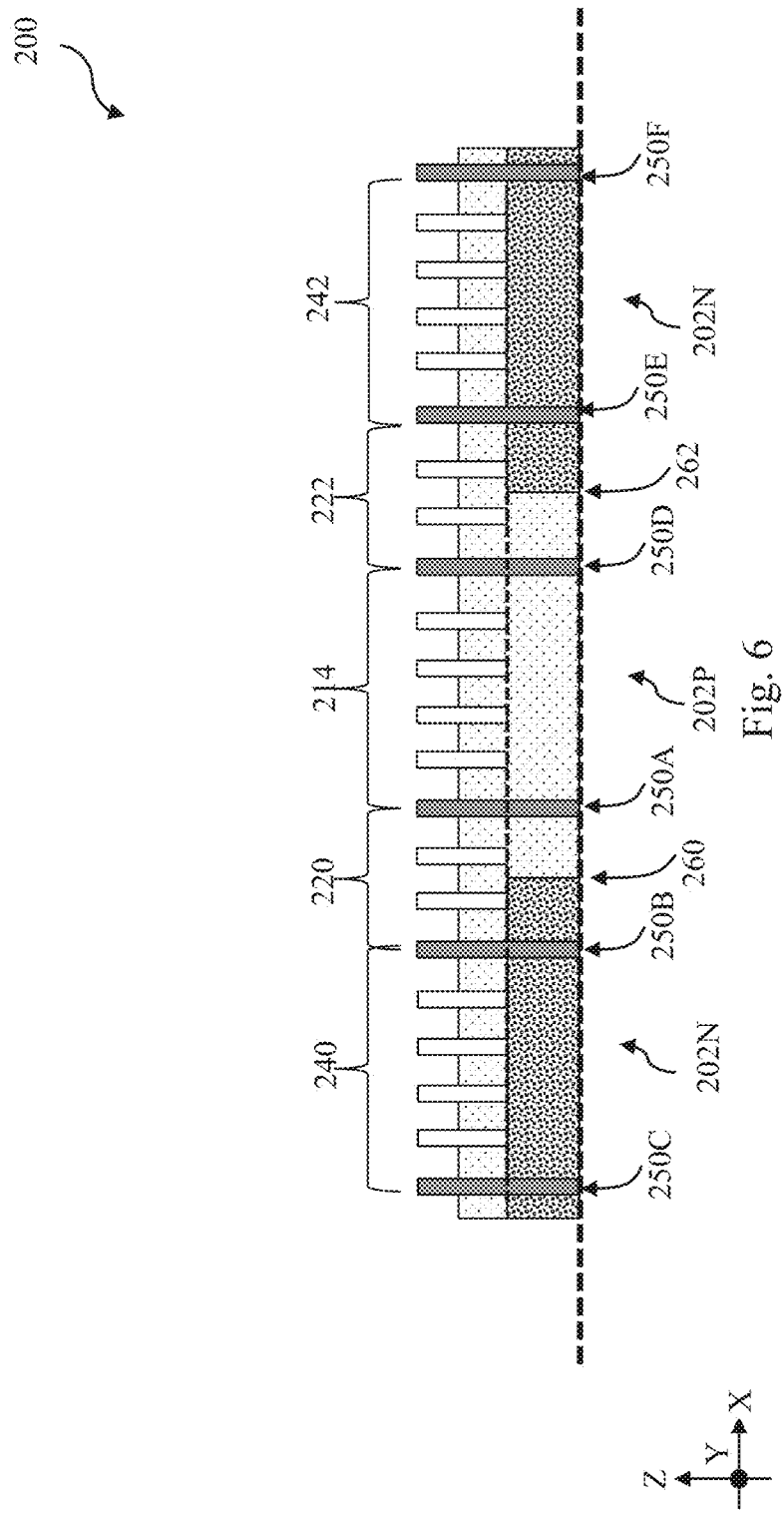
FIG. 6 is a side view of the portion of the second layout design in FIG. 4, according to various aspects of the present disclosure.

Reference is now made to FIGS. 5 and 6. FIG. 6 illustrates the II-II' cross-section of the active region 204P-4 along the Y-direction. It is noted that the II-II' cross-section passes along a lengthwise direction of the active region 204P-4. Like the layout design 100, the second layout design 200 does not include any OD break inserted between the third tap cell segment 214 and the standard cell segment 240 or between the third tap cell segment 214 and the standard cell segment 242. This is evidenced by the fact that no isolation feature (such as shallow trench isolation (STI)) is visible in FIG. 5. As described above, an OD break is a discontinuation in an active region formed before the formation of the isolation feature (such as STI). An OD break, if present, would be filled with the isolation feature. As FIG. 5 illustrates no isolation feature that breaks up the active region 204P-4, the second layout design 200 does not include any OD break or does not result in any OD break between a tap cell and a standard cell. Unlike the first layout design 100, the II-II' cross-section passes through two well junctions/transitions. Due to the shapes of the p-well 202P and the n-well 202N shown in FIGS. 9A and 9B, the II-II' cross-section pass through a first well transition 260 that falls within the third transition zone 220 and a second well transition 262 that falls within the fourth transition zone 222. The n-well 202N and the p-well 202P border one another at the first well transition 260 and the second well transition 262. While well transitions are known to give rise to well proximity effect (WPE), the WPE decreases with the shrinking size of the active regions. That is, at least with respect to advanced IC devices with ever smaller active region dimensions, the WPE is less significant than the LDE associated with transition of doped areas. Therefore, some of the performance and yield improvement realized by embodiments of the present disclosure find their root in the elimination of LDE.

Figure 7:
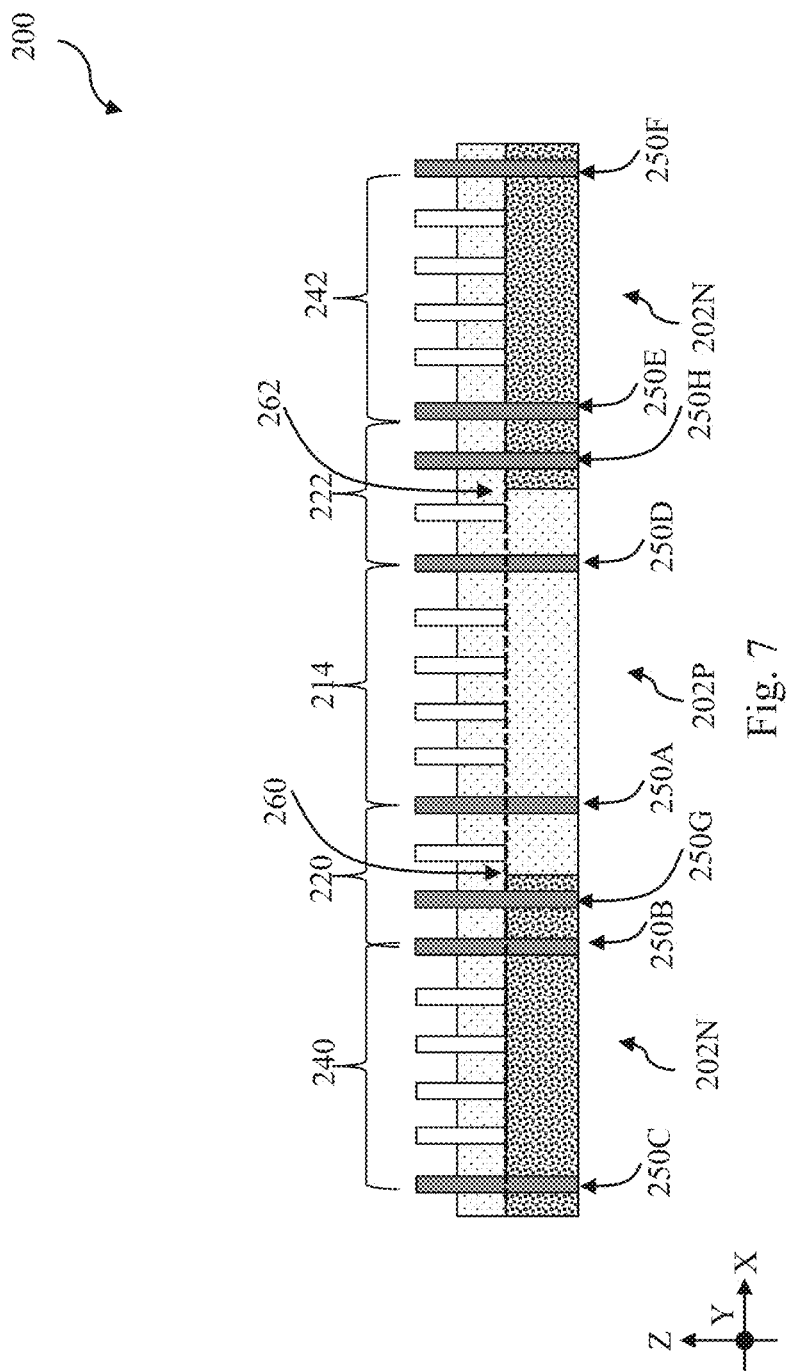
FIG. 7 is a side view of the portion of the second layout design in FIG. 4, according to various aspects of the present disclosure.
Figure 8:
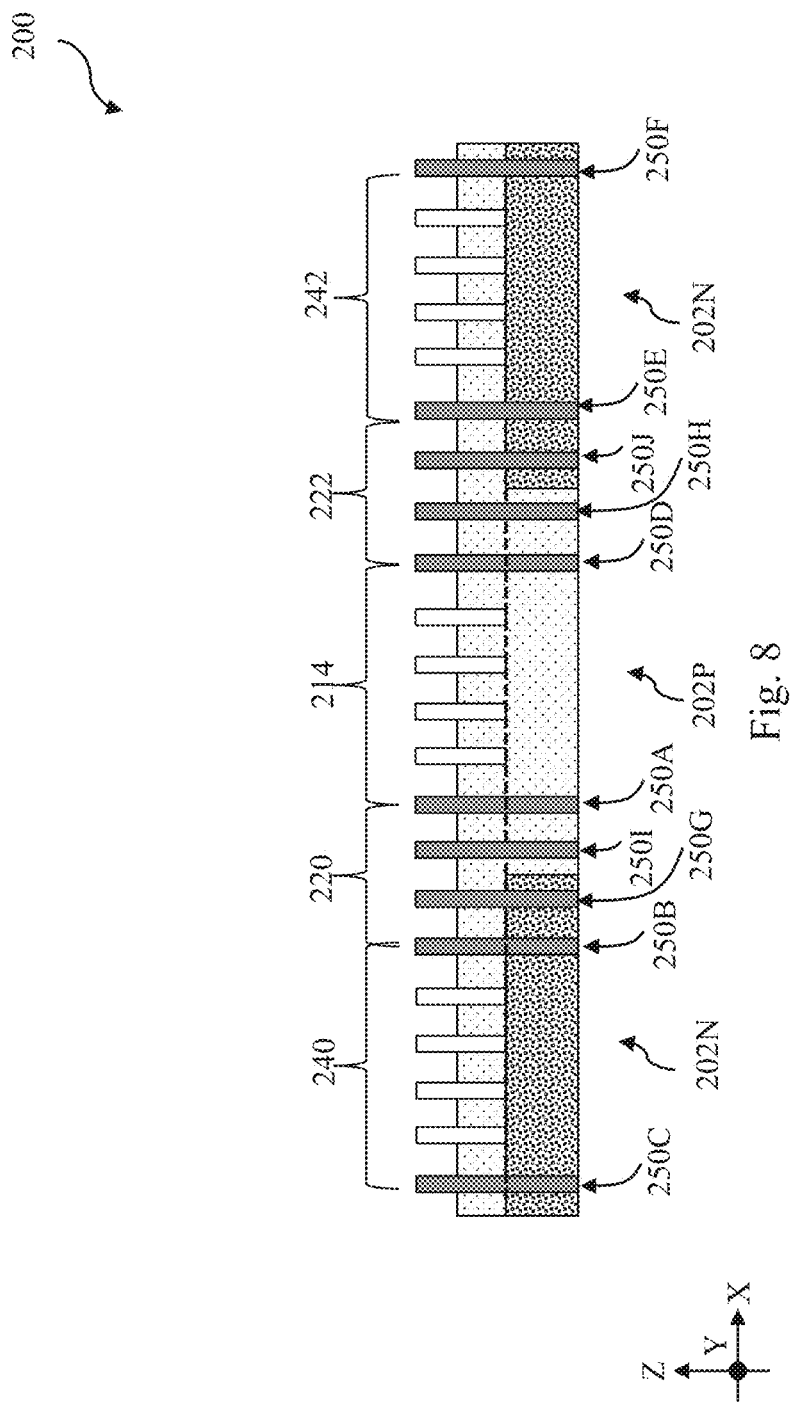
FIG. 8 is a side view of the portion of the second layout design in FIG. 4, according to various aspects of the present disclosure.

The present disclosure contemplates embodiments that further address the WPE. Reference is now made to FIGS. 7 and 8. As compared to the embodiment illustrated in FIG. 6, the embodiments in FIGS. 7 and 8 include additional fin-cut dielectric features. For example, the embodiment shown in FIG. 7 further includes a fifteenth fin-cut dielectric feature 250G in the third transition zone 220 and a sixteenth fin-cut dielectric feature 250H in the fourth transition zone 222. In some embodiments not shown in FIG. 7, the fifteenth fin-cut dielectric feature 250G may be formed right at the first well transition 260 and the sixteenth fin-cut dielectric feature 250H may be formed right at the second well transition 262. The embodiment shown in FIG. 8 further includes a seventeenth fin-cut dielectric feature 250I in the third transition zone 220 and an eighteenth fin-cut dielectric feature 250J in the fourth transition zone 222. It has been observed that additional fin-cut dielectric features may help reduce WPE. However, it is to be understood that these additional fin-cut dielectric features are optional as the WPE is already mitigated by the reduced dimensions of the active regions.

Based on the above discussions, it can be seen that the present disclosure offers advantages over conventional methods and semiconductor structures. It is understood, however, that other embodiments may offer additional advantages, and not all advantages are necessarily disclosed herein, and that no particular advantage is required for all embodiments. For example, the present disclosure provides a semiconductor structure that includes a tap cell that is not isolated from an adjacent standard cell by any OD break features that include a shallow trench isolation feature. Instead, in embodiments of the present disclosure, a tap cell is isolated from an adjacent standard cell by fin-cut dielectric features. For another example, the present disclosure also provides a semiconductor structure that includes interlocking wells that eliminate junctions of differently doped areas of an active region when placing tap cells among standard cells. Both the implementation of fin-cut dielectric features and the interlocking wells reduce area penalty associated with tap cells and increase area for functional devices. In addition, the implementation of fin-cut dielectric features and the interlocking wells may improve performance and yield by reducing WPE and LDE associated with placing tap cells among standard cells.

Thus, in one embodiment, the present disclosure provides a semiconductor structure that includes a first cell disposed over a first well doped with a first-type dopant, a second cell disposed over the first well, and a tap cell disposed over a second well doped with a second-type dopant different from the first-type dopant. The tap cell is sandwiched between the first cell and the second cell. The first cell includes a first plurality of transistors and the second cell includes a second plurality of transistors.

In some embodiments, the first cell includes a first active region, the second cell includes a second active region, and the tap cell includes a third active region. The first active region, the second active region and the third active region are doped with the second-type dopant. In some embodiments, the first-type dopant is n-type and the second-type dopant is p-type. In some implementations, the first-type dopant is p-type and the second-type dopant is n-type. In some instances, the first well includes a first shape that includes a base portion and at least one letter-shaped branch extending from the base portion. In some instances, the second well includes a second shape keyed to the first shape. In some implementations, each of the at least one letter-shaped branch is a T-shape portion.

In another embodiment, the present disclosure provides a semiconductor structure that includes a substrate, a first well in the substrate, the first well being doped with a first-type dopant; and a second well in the substrate, and the second well being doped with a second-type dopant different from the first-type dopant. A portion of the first well extends into the second well and three sides of the portion of the first well border the second well.

In some embodiments, the first well includes a base portion and a first T-shape portion coupled to the base portion via a first vertical bar portion of the first T-shape portion. The portion is the first T-shape portion. In some implementations, the second well includes a T-shape opening and the first T-shape portion of the first well substantially fits in the T-shape opening. In some instances, the first T-shape portion further includes a first horizontal bar portion coupled to the first vertical bar portion and the semiconductor structure further includes a tap cell over the vertical bar portion of the first T-shape portion. In some embodiments, the second well includes a second T-shape portion. The second T-shape portion includes a second vertical bar portion and a second horizontal bar portion coupled to the second vertical bar portion. The semiconductor structure further includes a first cell over the second horizontal bar portion. The first cell includes a plurality of transistors. In some instances, the tap cell includes a first active region, the first cell includes a second active region, and the first active region is aligned with the second active region. In some implementations, the tap cell is spaced apart from the first cell by at least one dielectric feature that extends into the first well. In some implementations, the tap cell is spaced apart from the first cell by at least one dielectric feature that extends into the second well. In some instances, the first well further includes an L-shape portion coupled to the base portion.

In another embodiment, the present disclosure provides a semiconductor structure that includes a substrate, a first cell disposed over an n-type well, a second cell disposed over the n-type well, and a tap cell disposed over a p-type well. The first cell includes a first plurality of transistors. The second cell includes a second plurality of transistors. The tap cell is sandwiched between the first cell and the second cell.

In some embodiments, the semiconductor structure further includes at least one dielectric feature that extends into the n-type well. The first cell includes a first active region and the tap cell includes a second active region. The first active region and the second active region are aligned and the first active region is spaced apart from the tap cell by the at least one dielectric feature. In some implementations, the first active region is not spaced apart from the tap cell by a shallow trench isolation feature. In some instances, the semiconductor structure further includes at least one dielectric feature that extends into the p-type well. The first cell includes a first active region and the tap cell includes a second active region. The first active region and the second active region are aligned and the first active region is spaced apart from the tap cell by the at least one dielectric feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a first cell disposed over a first region doped with a first-type dopant;
   a second cell disposed over a second region doped with the first-type dopant; and
   a tap cell disposed over a third region doped with a second-type dopant different from the first-type dopant, the tap cell being sandwiched between the first cell and the second cell,
   wherein the first region, the second region, and the third region are portions of a continuous active region and are directly over a same well.

2. The semiconductor structure of claim 1, wherein the first-type dopant is n-type and the second-type dopant is p-type.

3. The semiconductor structure of claim 1, wherein the first-type dopant is p-type and the second-type dopant is n-type.

4. The semiconductor structure of claim 1, wherein the continuous active region extends lengthwise along a first direction, the tap cell is a portion of a tap cell region extending lengthwise along a second direction perpendicular to the first direction.

5. The semiconductor structure of claim 1, wherein the tap cell is spaced apart from the first cell by at least one dielectric feature that extends into the same well.

6. The semiconductor structure of claim 1, wherein the first cell is not spaced apart from the tap cell by a shallow trench isolation feature.

7. A semiconductor structure, comprising:
a first cell disposed over a first region doped with a first-type dopant;
a second cell disposed over a second region doped with the first-type dopant; and
a tap cell segment disposed over a third region doped with a second-type dopant different from the first-type dopant, the tap cell segment being disposed between the first cell and the second cell,
wherein the first, second, and third regions are directly over a well doped with the second-type dopant,
wherein the tap cell segment is a portion of a tap cell extending beyond a boundary of the well from a top view.

8. The semiconductor structure of claim 7, wherein the first, second, and third regions are aligned.

9. The semiconductor structure of claim 7, wherein the tap cell segment is spaced apart from the first cell by a first dielectric feature that extends into the well.

10. The semiconductor structure of claim 9, wherein the first dielectric feature comprises an upper portion over the well and extending through the third region.

11. The semiconductor structure of claim 9, further comprising a second dielectric feature extending through the first region and extending into the well, wherein the first cell is further spaced apart from the tap cell segment by the second dielectric feature.

12. The semiconductor structure of claim 11, wherein the second dielectric feature comprises an upper portion over the well and extending through the first region.

13. The semiconductor structure of claim 7, wherein the well is a first well, the semiconductor structure further comprising a second well doped with the second-type dopant and extending lengthwise in parallel with the first well, wherein, in a top view, the tap cell extends over the second well.

14. The semiconductor structure of claim 7, wherein the well is a first well, the semiconductor structure further comprising a second well doped with the first-type dopant and extending lengthwise in parallel with the first well, wherein, in a top view, the tap cell extends over the second well.

15. A semiconductor structure, comprising:
a substrate;
a p-type well in the substrate;
a first n-doped region, a second n-doped region, and a p-doped region directly over the p-type well, the p-doped region being disposed between the first n-doped region and the second n-doped region;
a first cell disposed over the first n-doped region;
a second cell disposed over the second n-doped region;
a tap cell disposed over the p-doped region; and
a first dielectric feature including an upper portion disposed over the p-type well and a lower portion extending into the p-type well,
wherein the first cell is spaced apart from the tap cell by the first dielectric feature.

16. The semiconductor structure of claim 15, further comprising a second dielectric feature extending into the p-type well, wherein the first cell is further spaced apart from the tap cell by the second dielectric feature.

17. The semiconductor structure of claim 15, wherein the upper portion of the first dielectric feature extends through the p-doped region.

18. The semiconductor structure of claim 15, wherein the first n-doped region, the second n-doped region, and the p-doped region are aligned.

19. The semiconductor structure of claim 15, wherein the first n-doped region, the second n-doped region, and the p-doped region are portions of a continuous active region.

20. The semiconductor structure of claim 15, wherein the p-type well extends lengthwise along a first direction, the tap cell is a portion of a tap cell region extending lengthwise along a second direction perpendicular to the first direction.

* * * * *